United States Patent
Brazis et al.

(10) Patent No.: US 7,550,998 B2
(45) Date of Patent: Jun. 23, 2009

(54) INVERTER CIRCUIT HAVING A FEEDBACK SWITCH AND METHODS CORRESPONDING THERETO

(75) Inventors: Paul W. Brazis, South Elgin, IL (US);
Daniel R. Gamota, Palatine, IL (US);
Kin P. Tsui, Morton Grove, IL (US);
John B. Szczech, Schaumburg, IL (US);
Jie Zhang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/259,480

(22) Filed: Oct. 26, 2005

(65) Prior Publication Data

US 2007/0090858 A1   Apr. 26, 2007

(51) Int. Cl.
*H03K 19/094* (2006.01)
*H03K 19/0175* (2006.01)
*H03K 19/20* (2006.01)

(52) U.S. Cl. .................... 326/83; 326/112; 326/114

(58) Field of Classification Search ......... 326/112–114, 326/119–122; 257/202, 203, 206, 207, 210
See application file for complete search history.

(56) References Cited

U.S. PATENT DOCUMENTS 4,365,172 A * 12/1982 Prater ..................... 326/87
4,578,694 A    3/1986 Ariizumi et al.
5,099,148 A * 3/1992 McClure et al. ............... 326/86
6,744,297 B2 * 6/2004 Huang ......................... 327/324
7,078,937 B2 * 7/2006 Baude et al. ................. 326/112
7,088,145 B2 * 8/2006 Baude et al. ................. 326/121
2002/0030533 A1* 3/2002 De et al. ..................... 327/534
2005/0151195 A1* 7/2005 Kawase et al. .............. 257/347
2005/0189968 A1* 9/2005 Brazis et al. ................. 327/112

FOREIGN PATENT DOCUMENTS

JP       60158723    *  8/1985

OTHER PUBLICATIONS

International Search Report Dated Feb. 25, 2008.

* cited by examiner

*Primary Examiner*—Rexford N Barnie
*Assistant Examiner*—Dylan White

(57) ABSTRACT

An inverter circuit (500) having a drive transistor (102) that operably couples to a voltage bias input (101) (and where that drive transistor controls the inverter circuit output by opening and closing a connection between the output (105) and ground (104)) is further operably coupled to a feedback switch (401). In a preferred approach the feedback switch is itself also operably coupled to the voltage bias input and the output and preferably serves, when the drive transistor is switched "off," to responsively couple the voltage bias input to the drive transistor in such a way as to cause a gate terminal of the drive transistor to have its polarity relative to a source terminal of the drive transistor reversed and hence permit the inverter circuit to operate across a substantially full potential operating range of the drive transistor.

12 Claims, 4 Drawing Sheets

—PRIOR ART—

—PRIOR ART—

INVERTER CIRCUIT HAVING A FEEDBACK SWITCH AND METHODS CORRESPONDING THERETO

TECHNICAL FIELD

This invention relates generally to semiconductor devices and more particularly to inverter circuits.

BACKGROUND

Methods and apparatus that use such techniques as vacuum deposition to form semiconductor-based devices of various kinds are well known. Such techniques serve well for many purposes and can achieve high reliability, small size, and relative economy when applied in high volume settings. Recently, other techniques are being explored to yield semiconductor-based devices. For example, organic semiconductor materials (and other semiconductor materials) can be provided as a functional ink and used in conjunction with various printing techniques to yield printed semiconductor devices.

Printed semiconductor devices, however, yield considerably different end results and make use of considerably different fabrication techniques than those skilled in the art of semiconductor manufacture are prone to expect. Other differences exist as well. For example, a present typical printed semiconductor circuit is comprised only of semiconductors having a same carrier type (for example, only p-type transistors) whereas most modem CMOS transistors are comprised of multiple carrier types.

Other related differences become apparent within the context of a specific type of circuit. Consider, for example, a two-transistor inverter circuit. A printed two-transistor inverter circuit is readily formed but typically yields unsatisfactory performance. For example, though many printed p-type transistors are switched "on" with a negative gate bias, a significantly positive gate voltage is in many cases required to completely shut such a device "off." At zero gate voltage bias, the device is only partially switched "off." Therefore, if no such accommodation of reversal of gate bias polarity is made, and zero gate bias is used to switch the device "off," the effective on-off ratio is relatively low. This state of compromised on-off ratio is encountered in the example two-transistor inverter circuit.

As another example, the characteristic transfer curve of such an inverter is typically quite asymmetric (owing, at least in part, to the fact that the inverter will typically be very resistant to variations in input voltage when the output is relatively low but will be very sensitive when the output is high). The resultant low on/off ratio and low operating margins, in turn, can render such an inverter unduly susceptible to operational degradation, system and signal noise, and/or environmental conditions.

BRIEF DESCRIPTION OF THE DRAWINGS

The above needs are at least partially met through provision of the inverter circuit having a feedback switch and corresponding methods described in the following detailed description, particularly when studied in conjunction with the drawings, wherein.

Figure 1:
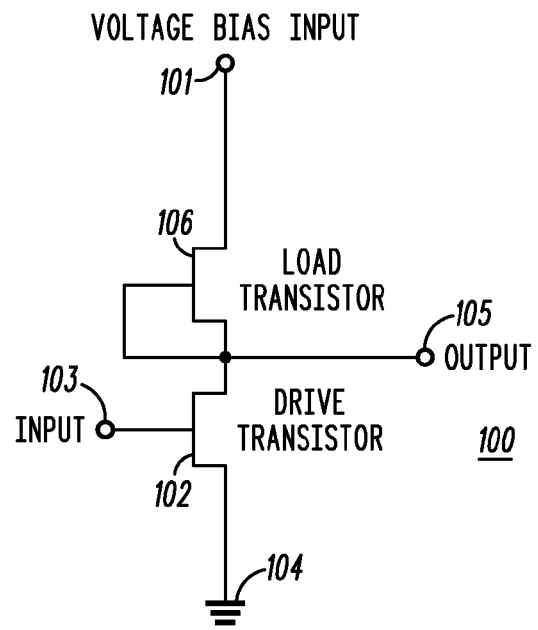
FIG. 1 comprises a prior art depiction of an inverter circuit.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, an inverter circuit having a drive transistor that operably couples to a voltage bias input (and where that drive transistor controls the inverter circuit output by opening and closing a connection between the output and ground) is further operably coupled to a feedback switch. In a preferred approach the feedback switch is itself also operably coupled to the voltage bias input and the output and preferably serves, when the drive transistor is switched "off," to responsively couple the voltage bias input to the drive transistor in such a way as to cause a gate terminal of the drive transistor to have its polarity referenced relative to a source terminal of the drive transistor reversed and hence permit the inverter circuit to operate across a substantially full potential operating range of the drive transistor.

In an optional though preferred configuration the feedback switch comprises a feedback transistor. Also pursuant to an optional though preferred approach, the feedback switch further comprises a supplemental drive transistor that operably couples between ground and a junction between the drive transistor and the feedback transistor.

So configured, the resultant inverter circuit will typically exhibit considerably improved gain (for example, increases of at least one order of magnitude are to be expected). Properly configured, in fact, the resultant transfer curve appears to closely resemble the transfer curve of an ideal logic inverter (at least under some operating conditions). These teachings are applicable in a variety of useful contexts. For example, a five-stage ring oscillator circuit has been built using these teachings that demonstrated successful oscillation for more than five consecutive days of operation.

Pursuant to one optional approach, the drive transistor may itself be "leaky." That is, the drive transistor may be configured and/or arranged to intentionally increase the "off" current to thereby improve switching speed stability. Such leakage can be accomplished in various ways. For example, such leakage may be achieved:

by intentionally thickening the semiconductor layer to thereby introduce parallel leakage across the corresponding transistor channel or by having at least one of the drain and source electrodes of the drive transistor intentionally larger than the gate terminal in order to provide electrode portions that extend beyond the gate terminal, wherein the electrode portions introduce parallel leakage across the transistor channel;

by using a semiconductor material that has a characteristically poor "off" current;

and/or by using a semiconductor material that has electrically conductive material disposed therein to increase the "off" current.

Such leakage leads to an intentional reduction of the on/off ratio as a result of increasing the device "off" current (where intentionally reducing the on/off ratio of course runs contrary to more usual prior art thinking that the on/off ratio should be maintained as high as possible in all cases). This, in turn, can lead to improved switching speed stability when operating the device in the dark as dark operating conditions can lead to a greatly increased on/off ratio and dark operating conditions typify the expected operating circumstances for many printed semiconductor materials such as organic semiconductor materials.

These and other benefits will become more evident to those skilled in the art upon making a thorough review and study of the following detailed description.

Referring now to the drawings, and in particular to FIG. 1, it may be helpful to first briefly characterize and describe a prior art two-transistor inverter circuit 100. This inverter circuit 100 has a first transistor 102 (such as a Field Effect Transistor (FET) that comprises a drive transistor wherein the gate of this drive transistor comprises the input 103 of the inverter circuit 100. The drain of this drive transistor 102 couples to ground 104 and its source comprises the output 105 of the inverter circuit 100. A second transistor comprising a load transistor 106 operably couples between the drive transistor 102 and a voltage bias input 101. More particularly, the source (and hence the inverter circuit output 105) of the drive transistor 102 connects in this embodiment to both the drain of the load transistor 106 and the input gate thereof.

In this embodiment, and presuming that both the load transistor 106 and the drive transistors 102 are of a same carrier type (such as, for example, a p-channel type), a significantly positive threshold voltage is required to achieve desired operation. The drive transistor 102 controls the output 105 by opening or closing a connection between the output 105 and ground 104. The load transistor 106 acts as a resistive load (active or passive) that allows the output 105 to be held at potential of the voltage bias input 101 when the drive transistor 102 opens the connection to ground 104. So configured, the gate voltage is always equal to or more negative than the voltage across the transistor channel. Since most printed devices are not completely "off" until the gate voltage is set more positive than the voltage across the channel, this configuration does not take advantage of the full operating range of most printed (and/or organic) active devices.

Figure 2:
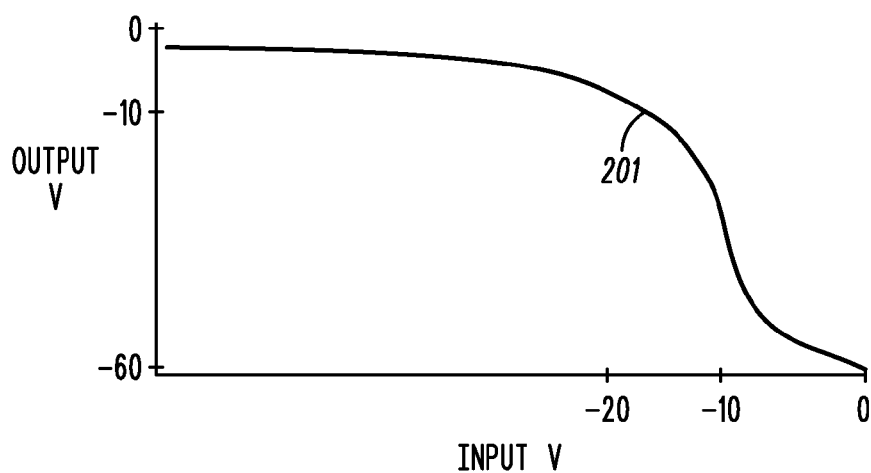
FIG. 2 comprises a transfer curve as corresponds to a prior art inverter circuit.

As shown in FIG. 2, a corresponding transfer curve 201 for such a configuration reflects such conditions. In general, such a prior art configuration as is described above has significantly degraded gain and transfer performance. It is also worth noting that such a configuration is further quite susceptible to temperature-based variations and other environmental factors of concern.

Figure 3:
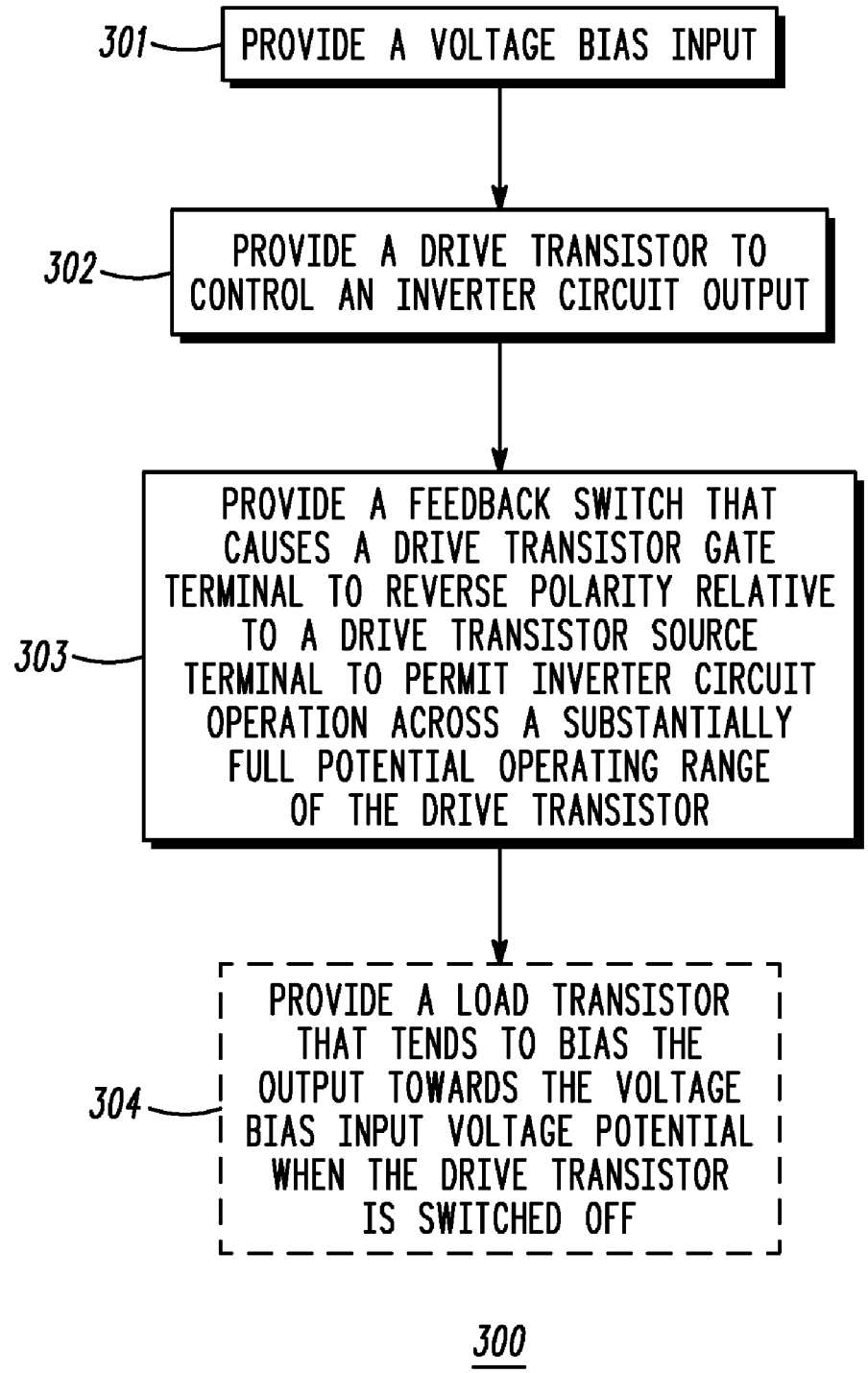
FIG. 3 comprises a flow diagram as configured in accordance with various embodiments of the invention.

Referring now to FIG. 3, an overall process 300 representative of the applicant's teachings comprises providing 301 a voltage bias input. This can be accomplished, for example, by printing (using any contact or non-contact printing process of choice) the voltage bias input on a substrate. This substrate can comprise any suitable material including various rigid and non-rigid materials. In a preferred embodiment, the substrate comprises a flexible substrate comprised, for example, of polyester or paper. The substrate can be comprised of a single substantially amorphous material or can comprise, for example, a composite of differentiated materials (for example, a laminate construct). In a typical embodiment the substrate will comprise an electrical insulator though for some applications, designs, or purposes it may be desirable to utilize a material (or materials) that tend towards greater electrical conductivity.

This process 300 also provides for provision 302 of a drive transistor that operably couples to the voltage bias input. In a preferred approach, this drive transistor controls an inverter circuit output by opening and closing a connection between the output of the inverter and ground. Such a drive transistor, of course, essentially accords with prior art practice in this regard.

By this process 300, however, one also provides 303 a feedback switch that operably couples to the voltage bias input, the inverter output, and the drive transistor. The feedback switch is preferably configured and coupled in such a way as to cause a gate terminal of the drive transistor to have its polarity relative to a source terminal of the drive transistor reversed and hence to permit the inverter circuit to operate across a substantially full potential operating range of the drive transistor. In an optional though preferred approach, this feedback switch comprises both a feedback transistor and a supplemental drive transistor that operably couples between ground and a junction between the drive transistor and the feedback transistor.

This process 300 also accommodates, if desired, the optional provision 304 of a load transistor that operably couples between the voltage bias input and the drive transistor and which tends to bias the output towards a voltage potential as appears at the voltage bias input when the drive transistor is switched "off."

The above-described device elements are preferably, though not necessarily, comprised of one or more inks including, for example, inks that comprise semiconductor material. Those skilled in the printing arts are familiar with both graphic inks and so-called functional inks (wherein "ink" is generally understood to comprise a suspension, solution, or dispersant that is presented as a liquid, paste, or powder (such as a toner powder). These functional inks are further comprised of metallic, organic, or inorganic materials having any of a variety of shapes (spherical, flakes, fibers, tubes) and sizes ranging, for example, from micron to nanometer. Functional inks find application, for example, in the manufacture of some membrane keypads. Though graphic inks can be employed as appropriate in combination with this process, these inks are more likely, in a preferred embodiment, to comprise a functional ink.

In a preferred approach, such inks are placed on the substrate by use of a corresponding printing technique. Those familiar with traditional semiconductor fabrication techniques such as vacuum deposition will know that the word "printing" is sometimes used loosely in those arts to refer to such techniques. As used herein, however, the word "printing" is used in a more mainstream and traditional sense and does not include such techniques as vacuum deposition that involve, for example, a state change of the transferred medium in order to effect the desired material placement. Accordingly, "printing" will be understood to include such techniques as screen printing, offset printing, gravure printing, xerographic printing, flexography printing, inkjetting, microdispensing, stamping, and the like. It will be understood that these teachings are compatible with the use of a plurality of such printing techniques during fabrication of a given element such as a semiconductor device. For example, it may be desirable to print a first device element (or portion of a device element) using a first ink and a first printing process and a second, different ink using a second, different print process for a different device element (or portion of the first device element).

For purposes of illustration and not by way of limitation, a transistor can be formed using such materials and processes as follows. A gate can be printed on a substrate of choice using a conductive ink of choice (such as but not limited to a functional ink containing copper or silver, such as DuPont's Ag 5028 combined with 2% 3610 thinner). Pursuant to one approach, air is blown over the printed surface after a delay of, for example, four seconds. An appropriate solvent can then be used to further form, define, or otherwise remove excess material from the substrate. Thermal curing at around 120 degrees Centigrade for 30 minutes can then be employed to assure that the printed gate will suitably adhere to the substrate.

A dielectric layer may then be printed over at least a substantial portion of the above-mentioned gate using, for example, an appropriate epoxy-based functional ink (such as, for example, DuPont's 5018A ultraviolet curable material). By one approach, the dielectric layer comprises a laminate of two or more layers. When so fabricated, each layer can be cured under an ultraviolet lamp before applying a next layer.

Additional electrodes are then again printed and cured using, for example, a copper or silver-based electrically conductive functional ink (such as, for example, DuPont's Ag 5028 with 2% 3610 thinner). These additional electrodes can comprise, for example, a source electrode and a drain electrode. A semiconductor material ink, such as but not limited to an organic semiconductor material ink such as various formulations of polythiophene or a polythiophene-family material such as poly(3-hexylthiophene) or an inorganic semiconductor material ink such as $SnO_2$, SnO, ZnO, Ge, Si, GaAs, InAs, InP, SiC, CdSe, and various forms of carbon (including carbon nanotubes), is then printed to provide an area of semiconductor material that bridges a gap between the source electrode and the drain electrode.

Figure 4A:
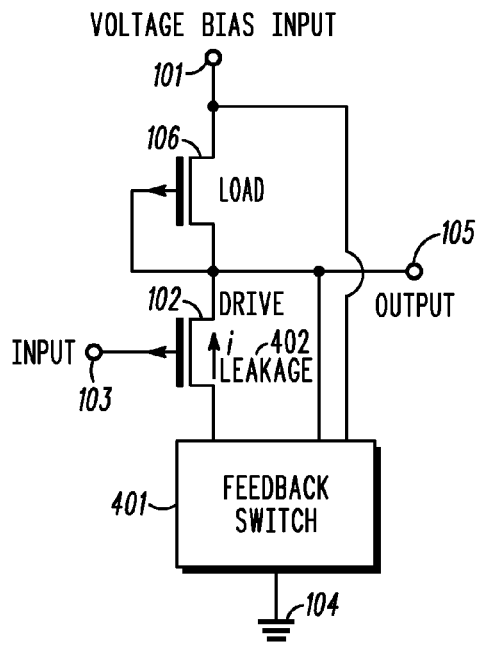
FIGS. 4A and 4B comprise schematic views as configured in accordance with various embodiments of the invention.
Figure 4B:
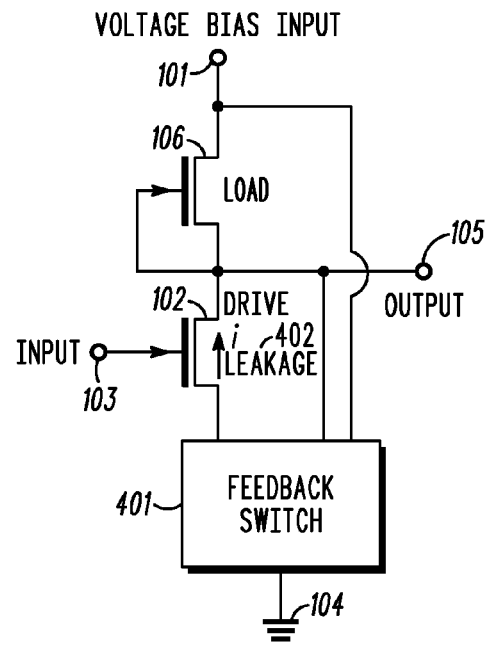
Figure 5:
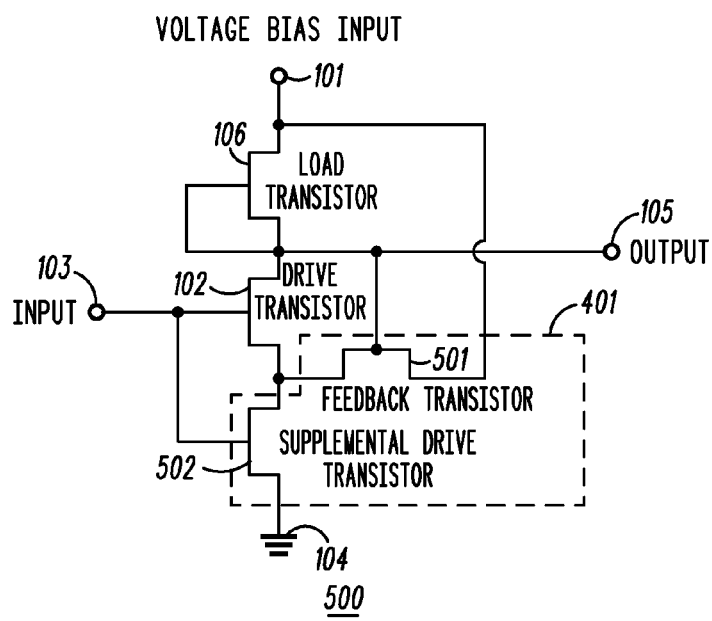
FIG. 5 comprises a schematic view as configured in accordance with various embodiments of the invention.

Referring now to FIGS. 4A and 4B (where FIG. 4A presents a p-channel-based embodiment using PMOS transistors and FIG. 4B presents an n-channel-based embodiment using NMOS transistors), such a process 300 as is described above can be employed to yield, for example, an inverter circuit 400 such as the one illustrated. Those skilled in the art will see and understand that the previously illustrated two-transistor inverter circuit now further includes a feedback switch 401 that couples and operates as described above. With reference to FIG. 5, the feedback switch 401 itself may be optionally but preferably comprised of a feedback transistor 501 (where the feedback transistor 501, for example, preferably serves, at least in part, to aid in pushing the output towards a lowest possible voltage) and a supplemental drive transistor 502 (where the supplemental drive transistor 502, for example, preferably serves, at least in part, to aid in causing the gate terminal of the drive transistor 102 (presuming a p-channel embodiment as shown in FIG. 4A) to be more positive than its source electrode).

So configured (and again with reference to the p-channel embodiment of FIG. 4A), the feedback transistor 501 places a negative voltage at the junction between the drive transistor 102 and the supplemental drive transistor 502 when the output 105 goes negative and reinforces a transition to a negative output. This, in turn, facilitates increased gain performance. The feedback transistor 501 will further be seen and understood to modify the source voltage of the supplemental drive transistor 502 by effectively influencing the voltage potential across its gate-source to be greater than zero voltage. This, in turn, greatly increases the available attainable gain of the inverter circuit 500.

Figure 6:
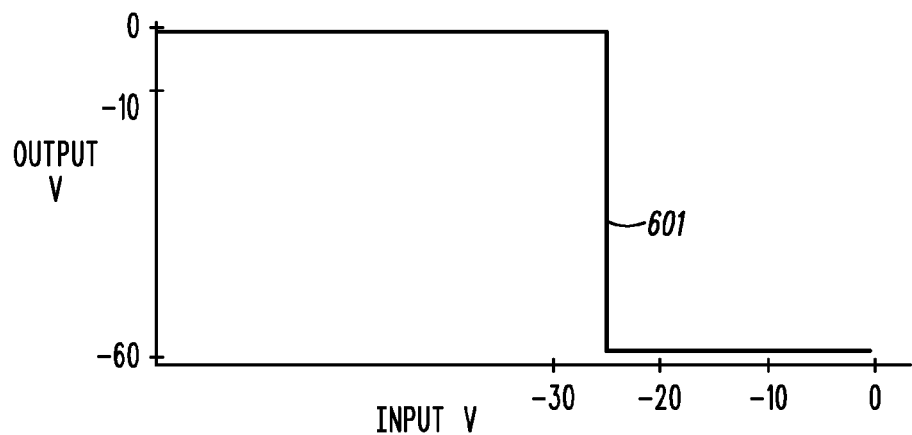
FIG. 6 comprises a transfer curve as corresponds to various embodiments of the invention.

FIG. 6 illustrates a corresponding transfer curve 601 that aids in demonstrating the considerable improvement these teachings offer in comparison to typical prior art performance. Those skilled in the art will also see and understand that the now-attainable transfer curve performance closely resembles the transfer curve of an ideal logic inverter.

Those skilled in the art will recognize that printed electronics often exhibit relatively low carrier mobility and that this results in low speed operation. Those skilled in the art are also typically aware that printed electronic devices are often highly sensitive to light. For example, switching speed for printed electronic circuits can slow even further when operating under dark conditions due at least in part to the corresponding increase in the on/off ratio that typically accompanies such operating conditions. Speeds can slow by two or even three orders of magnitude under such conditions. As printed circuits are often encapsulated to protect them from other environmental concerns, dark operating conditions are more often the norm rather than the exception. The applicants have discovered that such reduced switching speeds (due, for example, to dark operating conditions) can be at least partially offset by intentionally reducing the on/off ratio as corresponds to a device such as that described above. This is achieved, for example, by increasing device "off" current in order to thereby improve overall switching speeds and their stability while operating in the dark.

Figure 7:
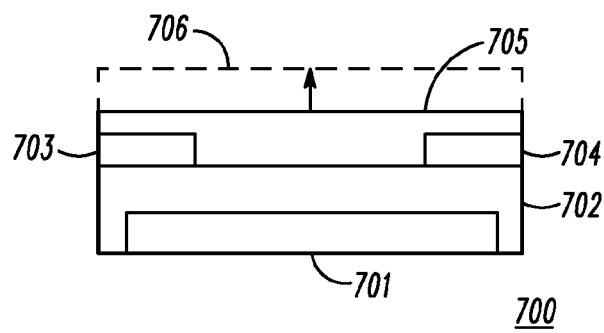
FIG. 7 comprises a side elevational view as corresponds to various embodiments of the invention.

With reference to FIG. 7, one way to achieve such results is to intentionally provide for leakage (as noted by reference numeral 402 in FIGS. 4A and 4B) that will in turn cause the desired increase in the "off" current. In the transistor depicted in FIG. 7, a gate 701 has a dielectric 702 printed thereover and further has two electrodes comprising a drain 703 and a source 704 printed on the dielectric 702. A semiconductor material 705 then fills the gap between the drain 703 and source 704. One approach to achieving such leakage 402 is to provide a semiconductor material 705 that exhibits a characteristically poor "off" current. For example, poly(3-hexylthiophene) (often known as P3HT) tends to exhibit a large "off" current which increases further upon exposure to atmospheric oxygen.

Another approach to achieving such leakage 402 is to use a semiconductor material 705 having electrically conductive material disposed therein that serves to increase the "off" current. Yet another approach is to intentionally thicken the semiconductor material layer (as is suggested by the phantom line denoted by reference numeral 706) to thereby introduce parallel leakage across the corresponding transistor channel.

Figure 8:
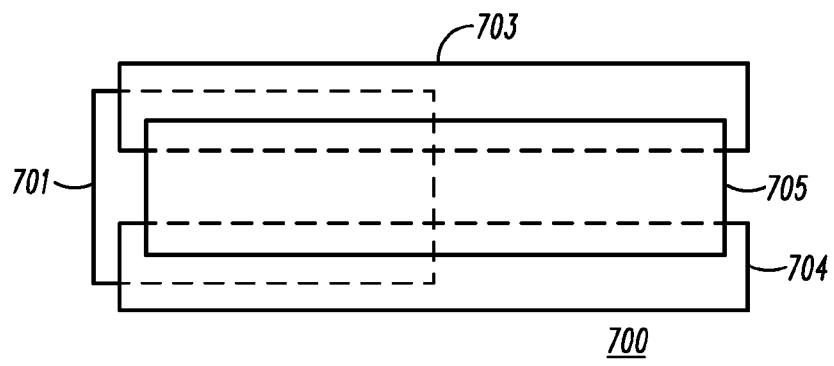
FIG. 8 comprises a top plan view as corresponds to various embodiments of the invention.

While each of the above approaches will provide at least some benefit as described, a preferred approach more likely comprises providing at least one of the drain and source electrode 703 and 704 in a size that is intentionally larger than the gate terminal 701 such that the electrode portions extend beyond the gate terminal to thereby introduce parallel leakage across the transistor channel. FIG. 8 depicts an illustration of such a configuration (and where the dielectric layer has been omitted for the sake of clarity). In particular, this architecture provides considerable parallel leakage at the sides of the device. Such leakage tends to occur because portions of the channel are not affected by the gate 701 in such a configuration and therefore cannot be switched "off." Also, this approach is easily controlled during layout and manufacturing and allows the designer great control over how much leakage is added. In addition, this approach also tends to permit savings with respect to the quantities of semiconductor material ink that must be applied.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. An inverter circuit comprising:
   a voltage bias input;
   a drive transistor operably coupled to the voltage bias input wherein the drive transistor controls an inverter circuit output by opening and closing a connection between the output and ground and wherein the drive transistor further comprises a drain and a source electrode that is intentionally larger than a gate terminal of the drive transistor in a channel width direction to provide electrode portions that extend beyond the gate terminal, wherein the electrode portions introduce parallel leakage across the transistor channel and thereby increase "off" current to thereby improve switching speed stability;
   a feedback switch operably coupled to the voltage bias input, the output, and the drive transistor, wherein when the drive transistor is switched "off" the feedback switch responsively couples the voltage bias input to the drive transistor in such as way as to cause a gate terminal of the drive transistor to have its polarity relative to a source terminal of the drive transistor reversed and hence permit the inverter circuit to operate across a substantially full potential operating range of the drive transistor.

2. The inverter circuit of claim 1 wherein the drive transistor and the feedback switch comprise printed semiconductor devices.

3. The inverter circuit of claim 1 wherein all transistors as comprise the inverter circuit are of the same carrier type.

4. The inverter circuit of claim 1 further comprising:
   a load transistor operably coupled between the voltage bias input and the drive transistor and which tends to bias the output towards a voltage potential as appears at the voltage bias input when the drive transistor is switched "off."

5. The inverter circuit of claim 1 wherein the feedback switch comprises a feedback transistor.

6. The inverter circuit of claim 5 wherein the feedback switch further comprises a supplemental drive transistor that operably couples between ground and a junction between the drive transistor and the feedback transistor.

7. A method comprising:
   providing a voltage bias input;
   providing a drive transistor operably coupled to the voltage bias input wherein the drive transistor can control an inverter circuit output by opening and closing a connection between the output and ground and wherein the drive transistor further comprises a drain and a source electrode that is intentionally larger than a gate terminal of the drive transistor in a channel width direction to provide electrode portions that extend beyond the gate terminal, wherein the electrode portions introduce parallel leakage across the transistor channel and thereby increase "off" current to thereby improve switching speed stability;
   providing a feedback switch operably coupled to the voltage bias input, the output, and the drive transistor, wherein when the drive transistor is switched "off" the feedback switch responsively couples the voltage bias input to the drive transistor in such a way as to cause a gate terminal of the drive transistor to have its polarity relative to a source terminal of the drive transistor reversed and hence permit the inverter circuit to operate across a substantially full potential operating range of the drive transistor.

8. The method of claim 7 wherein:
   providing a voltage bias input comprises printing the voltage bias input on a substrate;
   providing the drive transistor comprises printing a semiconductor device on the substrate.

9. The method of claim 8 wherein printing a semiconductor device on the substrate comprises at least one of:
   using a contact printing process;
   using a non-contact printing process.

10. The method of claim 7 further comprising:
    providing a load transistor operably coupled between the voltage bias input and the drive transistor and which tends to bias the output towards a voltage potential as appears at the voltage bias input when the drive transistor is switched "off."

11. The method of claim 7 wherein the feedback switch comprises a feedback transistor.

12. The method of claim 11 wherein the feedback switch further comprises a supplemental drive transistor that operably couples between ground and a junction between the drive transistor and the feedback transistor.

* * * * *